United States Patent
Chen et al.

(10) Patent No.: US 12,557,602 B2
(45) Date of Patent: *Feb. 17, 2026

(54) WAFER POSITIONING METHOD AND APPARATUS

(71) Applicant: Taiwan Semiconductor Manufacturing Co., Ltd., Hsinchu (TW)

(72) Inventors: Chia-Cheng Chen, Hsinchu (TW); Chih-Kai Yang, Taipei (TW); Liang-Yin Chen, Hsinchu (TW); Huicheng Chang, Tainan (TW); Yee-Chia Yeo, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/627,057

(22) Filed: Apr. 4, 2024

(65) Prior Publication Data

US 2024/0274478 A1 Aug. 15, 2024

Related U.S. Application Data

(63) Continuation of application No. 17/459,164, filed on Aug. 27, 2021, now Pat. No. 11,978,677.

(Continued)

(51) Int. Cl.
*H01L 21/66* (2006.01)
*H01J 37/20* (2006.01)
(Continued)

(52) U.S. Cl.
CPC .............. *H01L 22/20* (2013.01); *H01J 37/20* (2013.01); *H01J 37/22* (2013.01);
(Continued)

(58) Field of Classification Search
CPC ..... H01L 22/20; H01L 21/265; H01L 23/544; H01L 2223/54426; H01L 21/67069; H01L 21/67103; H01L 21/67213; H01L 21/681; H01L 2223/5442; H01L 2223/54453; H01L 2223/54493; H01L 22/12; H01L 21/682; H01J 37/20; H01J 37/22; H01J 37/3045; H01J 37/3171; H01J 2237/20214; H01J 2237/30438; H01J 2237/31701
See application file for complete search history.

(56) References Cited

U.S. PATENT DOCUMENTS 6,225,012 B1 * 5/2001 Nishi .................... G03F 9/7011
430/30
9,354,047 B2 * 5/2016 Kannaka .............. G01B 11/272
(Continued)

FOREIGN PATENT DOCUMENTS

TW 200701382 A 1/2007

*Primary Examiner* — J.E. Schoenholtz
(74) *Attorney, Agent, or Firm* — Slater Matsil, LLP

(57) ABSTRACT

In an embodiment, a method includes: placing a wafer on an implanter platen, the wafer including alignment marks; measuring a position of the wafer by measuring positions of the alignment marks with one or more cameras; determining an angular displacement between the position of the wafer and a reference position of the wafer; and rotating the implanter platen by the angular displacement.

20 Claims, 11 Drawing Sheets

Related U.S. Application Data

(60) Provisional application No. 63/214,517, filed on Jun. 24, 2021.

(51) Int. Cl.
 *H01J 37/22* (2006.01)
 *H01J 37/304* (2006.01)
 *H01J 37/317* (2006.01)
 *H01L 21/265* (2006.01)
 *H01L 23/544* (2006.01)

(52) U.S. Cl.
 CPC ...... *H01J 37/3045* (2013.01); *H01J 37/3171* (2013.01); *H01L 21/265* (2013.01); *H01L 23/544* (2013.01); *H01J 2237/20214* (2013.01); *H01J 2237/30438* (2013.01); *H01L 2223/54426* (2013.01)

(56) References Cited

U.S. PATENT DOCUMENTS

| | | | |
|---|---|---|---|
| 10,134,622 B2* | 11/2018 | Wagenleitner | G01B 11/272 |
| 11,978,677 B2* | 5/2024 | Chen | H01L 21/681 |
| 2001/0016293 A1* | 8/2001 | Nishi | G03F 9/7046 |
| | | | 430/30 |
| 2003/0053058 A1* | 3/2003 | Tanaka | G03F 9/7076 |
| | | | 356/401 |
| 2003/0053059 A1* | 3/2003 | Mishima | G03F 9/7046 |
| | | | 356/401 |
| 2007/0095791 A1* | 5/2007 | Shinozaki | G03F 9/7003 |
| | | | 156/345.55 |
| 2007/0096763 A1* | 5/2007 | Ehrmann | B23K 26/0861 |
| | | | 324/754.03 |
| 2007/0153253 A1* | 7/2007 | Van Buel | G03F 7/70716 |
| | | | 355/72 |
| 2008/0151234 A1* | 6/2008 | Imai | G01N 21/95607 |
| | | | 702/95 |
| 2010/0231928 A1* | 9/2010 | Tanaka | H01L 21/67092 |
| | | | 355/72 |
| 2014/0293293 A1* | 10/2014 | Vodnick | G01Q 60/366 |
| | | | 356/614 |
| 2016/0118250 A1* | 4/2016 | Tamaso | G03F 9/708 |
| | | | 438/5 |
| 2017/0192367 A1 | 7/2017 | Lai et al. | |
| 2017/0287752 A1* | 10/2017 | Godet | H01L 21/67213 |
| 2018/0151400 A1* | 5/2018 | Wang | G06T 7/73 |
| 2019/0121246 A1* | 4/2019 | Magome | G03F 7/70858 |
| 2020/0075500 A1 | 3/2020 | Housley et al. | |
| 2020/0294835 A1* | 9/2020 | Wu | G03F 9/7084 |
| 2022/0334505 A1* | 10/2022 | Ma | H01L 23/544 |

* cited by examiner

WAFER POSITIONING METHOD AND APPARATUS

PRIORITY CLAIM AND CROSS-REFERENCE

This application is a continuation of U.S. patent application Ser. No. 17/459,164, filed on Aug. 27, 2021, entitled "Wafer Positioning Method and Apparatus," which claims the benefit of U.S. Provisional Application No. 63/214,517, filed on Jun. 24, 2021, which applications are hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
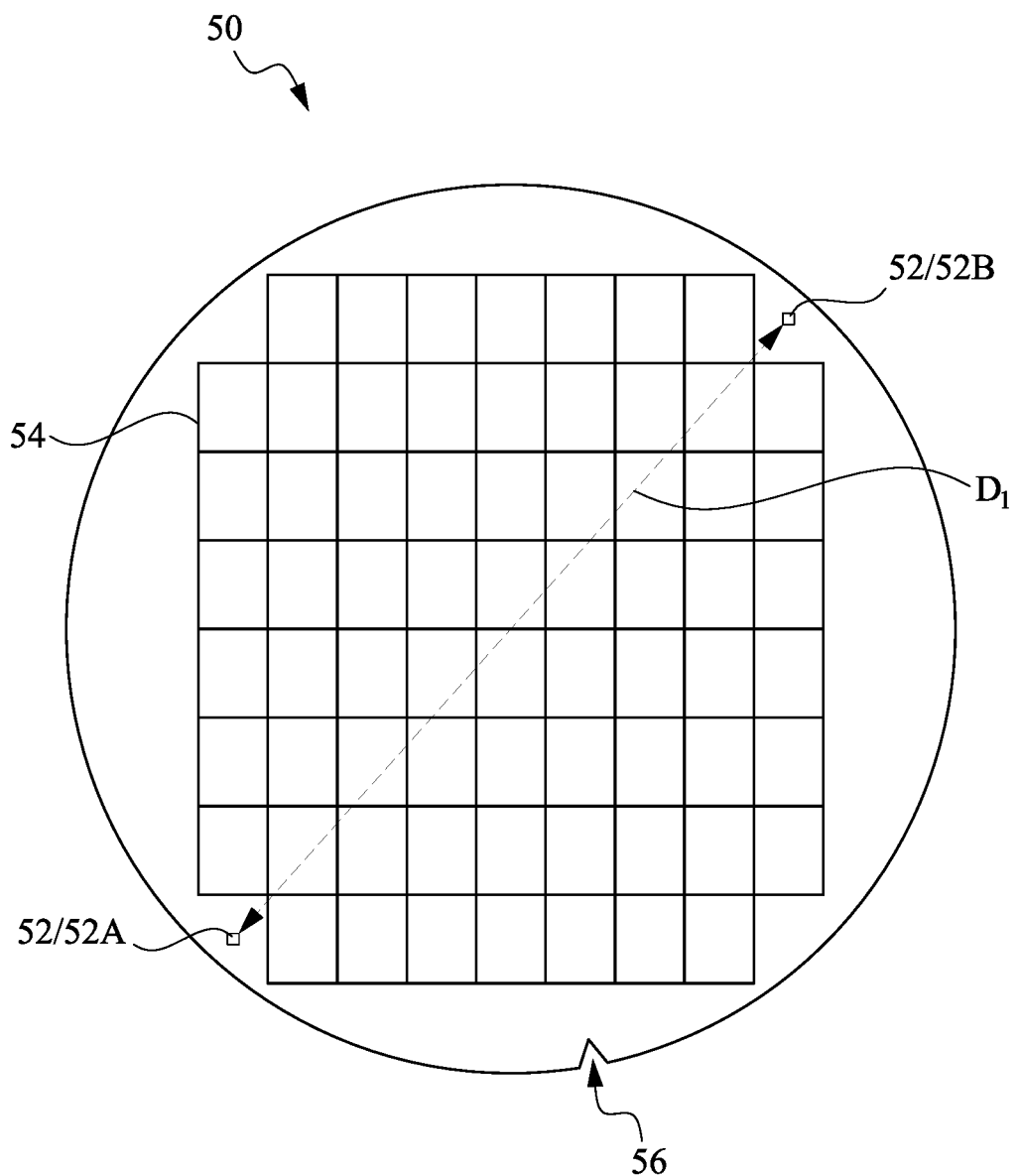
FIG. 1 is a top-down view of a wafer, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to various embodiments, an ion exposure apparatus includes an platen and one or more alignment sensor(s) for detecting a position of a wafer on the platen. The position of the wafer has a linear component (e.g., in the X-direction and the Y-direction) and/or an angular component (e.g., around an axis of rotation in the Z-direction). The wafer includes alignment marks, which are patterned in the wafer. In some embodiments, the alignment sensor(s) are cameras which capture images of the alignment marks, and the position of the wafer is determined by measuring positions of the alignment marks in the captured images using machine vision. Misalignment between the measured position of the wafer and a reference position for the wafer may thus be determined and corrected. The reference position for the wafer is a position where the wafer is aligned (linearly and/or angularly) with respect to an ion beam that will be generated by the ion exposure apparatus during operation. In some embodiments, the ion exposure apparatus is an implanter and the ion beam is generated to implant a desired element into the wafer. The platen is operable to translate and/or rotate the wafer to correct misalignment of the position of the wafer with respect to the ion beam such that, during generation of the ion beam, the center of the wafer is linearly aligned with the center of the ion beam, and/or the orientation of the wafer is angularly aligned with the orientation of the ion beam. Aligning the wafer with respect to the ion beam may improve within-wafer uniformity of the ion exposure process, reduce wafer-to-wafer process variations, reduce device defects, and improve device performance.

FIG. 1 is a top-down view of a wafer 50, in accordance with some embodiments. As will be subsequently described in greater detail, the wafer 50 will be processed by an ion exposure process. In some embodiments, the ion exposure process is performed to implant a desired element (e.g., an n-type and/or p-type dopant) into the wafer 50.

The wafer 50 includes alignment marks 52 and integrated circuit dies 54, which are formed in and/or on a substrate by performing photolithography and chemical processing techniques (e.g., deposition, etching, implanting, etc.). The substrate may be a silicon substrate. In some embodiments, the substrate includes another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; any other suitable material; or combinations thereof. In some embodiments, the substrate is a semiconductor-on-insulator substrate, such as a silicon-on-insulator (SOI) substrate, a silicon germanium-on-insulator (SGOI) substrate, or a germanium-on-insulator (GOI) substrate.

The alignment marks 52 are formed before the integrated circuit dies 54. As will be subsequently described in greater detail, the alignment marks 52 may each include multiple trenches patterned in the wafer 50. The wafer 50 initially includes a notch 56. The patterning process used to form the alignment marks 52 is aligned to the notch 56 in the wafer 50. The notch 56 is large, and thus only provide coarse alignment.

In this embodiment, a single pair of the alignment marks 52 (including a first alignment mark 52A and a second alignment mark 52B) are formed. The alignment marks 52A, 52B are disposed at edge regions of the wafer 50, and are arranged so that a line extends through the alignment marks 52A, 52B and the center of the wafer 50, with the center of the wafer 50 being disposed between the alignment marks 52A, 52B. The alignment marks 52A, 52B are separated by a desired distance so that there is sufficient area between them for the integrated circuit dies 54. In some embodiments, the alignment marks 52A, 52B are separated by a distance $D_1$ in the range of 280 mm to 290 mm. In another embodiment (subsequently described for FIG. 7), multiple pairs of the alignment marks 52 are formed, and each pair has a similar arrangement as previously described.

Figure 2:
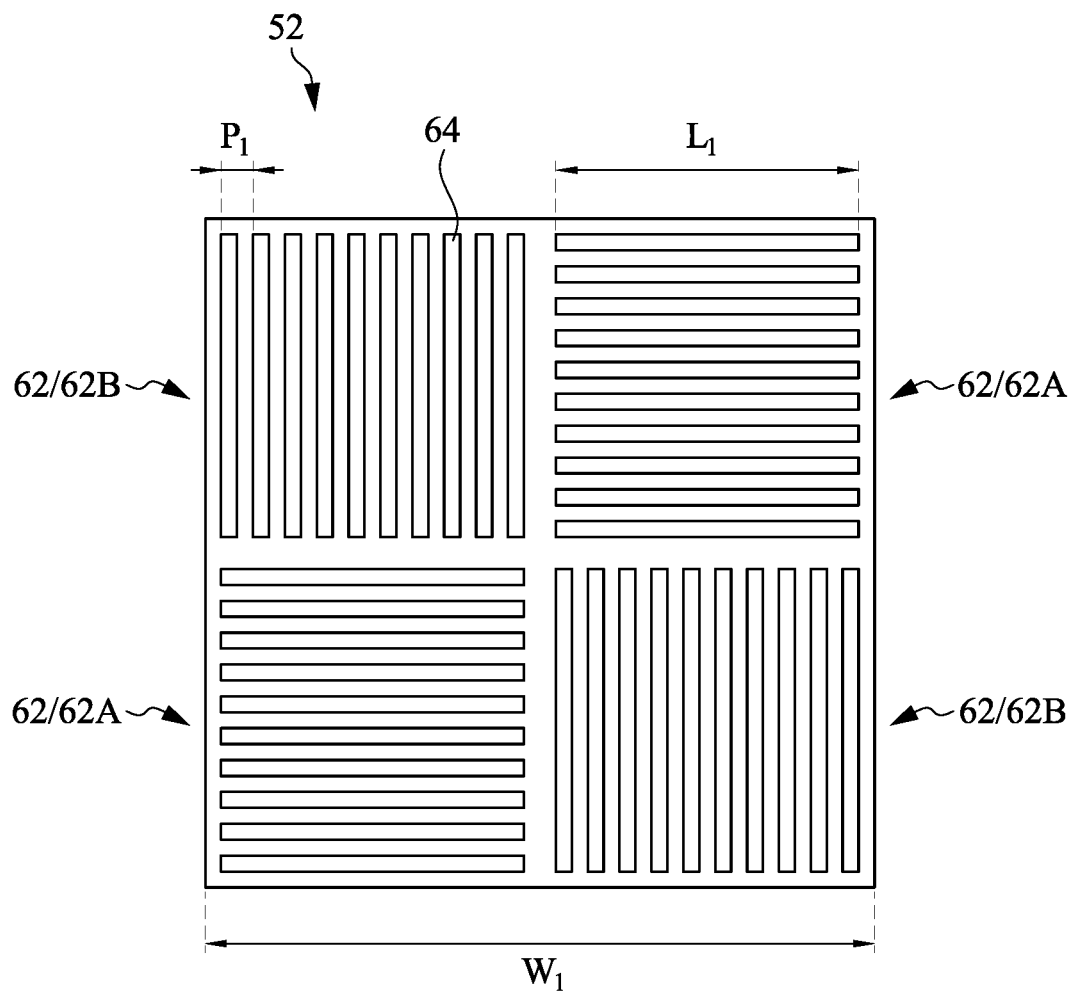
FIG. 2 is a top-down view of an alignment mark, in accordance with some embodiments.

FIG. 2 is a top-down view of an alignment mark 52, in accordance with some embodiments. The structure and dimensions of the alignment mark 52 are shown. The dimensions of the alignment mark 52 determines how easily is can be resolved by machine vision using a camera, with alignment marks 52 of larger widths being resolvable with lower-resolution cameras. In some embodiments, the alignment mark 52 has a square shape with a width W, in the range of 400 µm to 550 µm.

The alignment mark 52 includes one or more grating(s) 62. Each grating 62 includes multiple trenches 64 patterned in the wafer. In the illustrated embodiment, the alignment mark 52 includes four gratings 62. In some embodiments, the alignment mark 52 includes more than four gratings 62. In some embodiments, the alignment mark 52 includes less than four gratings 62, and may include a single grating 62.

The gratings 62 may be oriented in several directions. The pattern of the trenches 64 may be a predetermined pattern that can be recognized by machine vision using a camera. In the illustrated embodiment, a first subset of the gratings 62A are oriented so that their trenches 64 have longitudinal axes in a first direction (e.g., the X-direction in FIG. 2), and second subset of the gratings 62B are oriented so that their trenches 64 have longitudinal axes in a second direction (e.g., the Y-direction in FIG. 2). In some embodiments, the gratings 62 are oriented so that the trenches 64 are symmetrically laid out. In some embodiments, the gratings 62 are oriented so that the trenches 64 are asymmetrically laid out.

The trenches 64 are patterned in the wafer 50 before other components (e.g., the layers/features of the integrated circuit dies 54) are formed in/on the wafer. Specifically, the trenches 64 are patterned directly in a semiconductor substrate. The trenches 64 may be patterned in the wafer 50 using acceptable photolithography and etching techniques. The pitch and length of the trenches 64 determines how easily they can be resolved by a camera, with trenches 64 of larger pitches and larger lengths being resolvable with lower-resolution cameras. In some embodiments, the trenches 64 have a pitch $P_1$ in the range of 10 µm to 20 µm, and the trenches 64 have a length $L_1$ in the range of 50 µm to 300 µm.

Referring again to FIG. 1, the integrated circuit dies 54 are formed between the alignment marks 52. The integrated circuit dies 54 include various material layers (e.g., dielectric material layers, semiconductor material layers, conductive material layers, and/or the like) and/or features (e.g., semiconductor features such as doped regions/features; metal features such as gate features, interconnect features, etc.; and/or the like) for forming integrated circuits. The integrated circuit dies 54 are laid out in a grid pattern in the wafer 50, which may be centered in the wafer 50. Scribe lines separate the integrated circuit dies 54, and the integrated circuit dies 54 will be subsequently diced by sawing along the scribe lines. The scribe lines define the edges of the integrated circuit dies 54. In some embodiments, the integrated circuit dies 54 are formed after the alignment marks 52. The patterning processes used to form the integrated circuit dies 54 are aligned to the alignment marks 52 instead of to the notch 56. The alignment marks 52 are smaller than the notch 56, and so alignment during the patterning processes may be performed more accurately. In some embodiments, the alignment marks 52 are patterned in the zeroth layer of the wafer 50 simultaneously with the first patterning process used to form the integrated circuit dies 54, and subsequent patterning process are aligned to the alignment marks 52.

Figure 3:
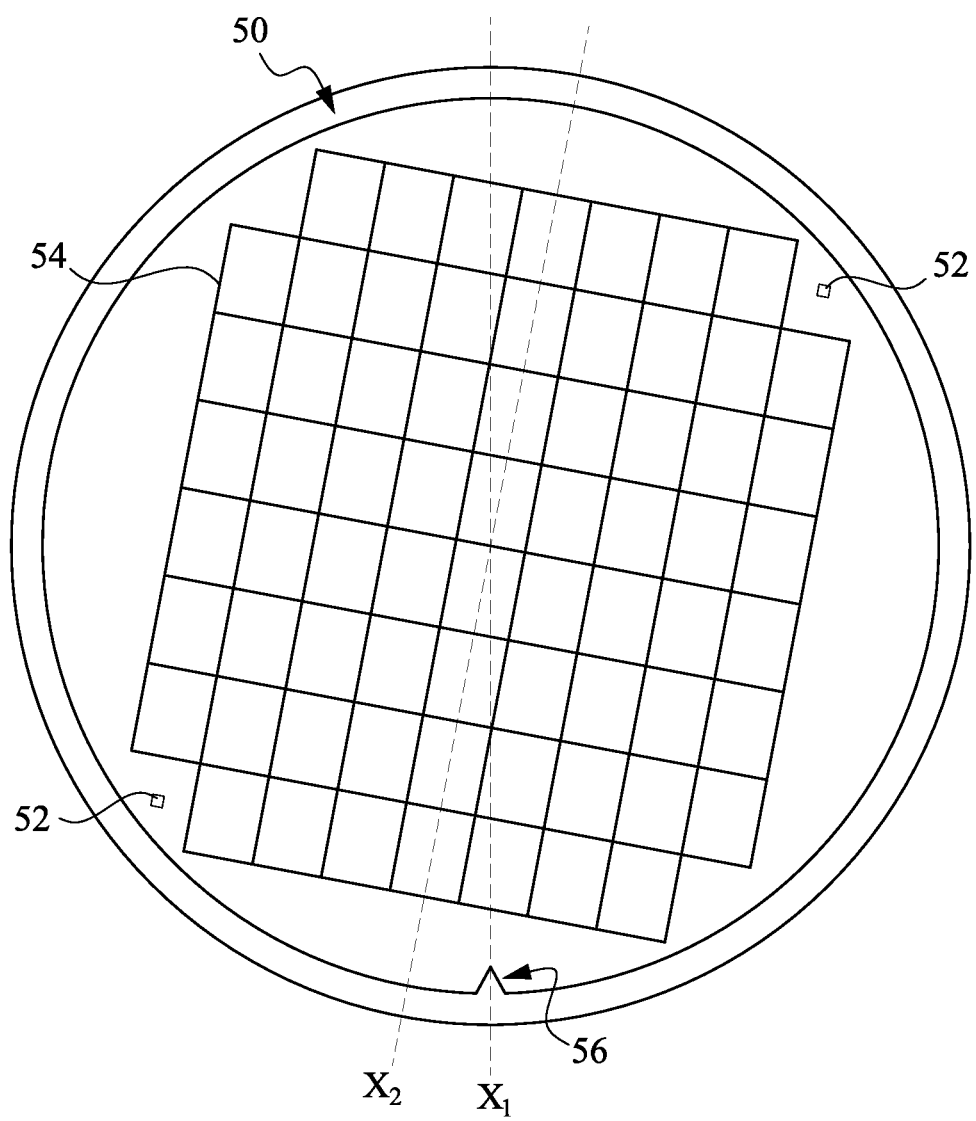
FIG. 3 is a top-down view of a wafer on a platen, in accordance with some embodiments.

During formation of the integrated circuit dies 54, one or more ion exposure process(es) are performed on the wafer 50. FIG. 3 is a top-down view of a wafer 50 on a platen 74 before an ion exposure process, in accordance with some embodiments. When the wafer 50 is initially placed on the platen 74, the notch 56 is used to align (linearly and/or angularly) the wafer 50 with a reference position (e.g., with respect to an ion beam that will be generated during the ion exposure process). However, as noted above, the patterning processes used to form the integrated circuit dies 54 are aligned to the alignment marks 52 instead of to the notch 56. Therefore, when the notch 56 is used to align the wafer 50 with the reference position, the wafer 50 may be linearly aligned with the reference position, but the edges of the integrated circuit dies 54 may be angularly displaced from the reference position. For example, as shown in FIG. 3, the notch 56 may be angularly aligned with an axis $X_1$, which indicates the orientation of the ion beam, but the edges of the integrated circuit dies 54 may be angularly aligned with an axis $X_2$, where the axis $X_2$ is angularly displaced from the axis $X_1$. Although not shown in FIG. 3, the center of the wafer 50 may also be linearly displaced from the center of the platen 74. As such, during generation of the ion beam, the center of the wafer may be linearly displaced from the center of the ion beam, and/or the orientation of the wafer may be angularly displaced from the orientation of the ion beam. As will be subsequently described in greater detail, the alignment marks 52 will be used by a wafer alignment process in which the platen 74 is translated to reduce the linear displacement of the wafer 50 (also referred to as "off-center error") and/or rotated to reduce the angular displacement of the wafer 50 (also referred to as "rotational error") with respect to the ion beam. Aligning the wafer 50 with respect to the ion beam may improve within-wafer uniformity of the ion exposure process, reduce wafer-to-wafer process variations, reduce device defects, and improve device performance.

Figure 4A:
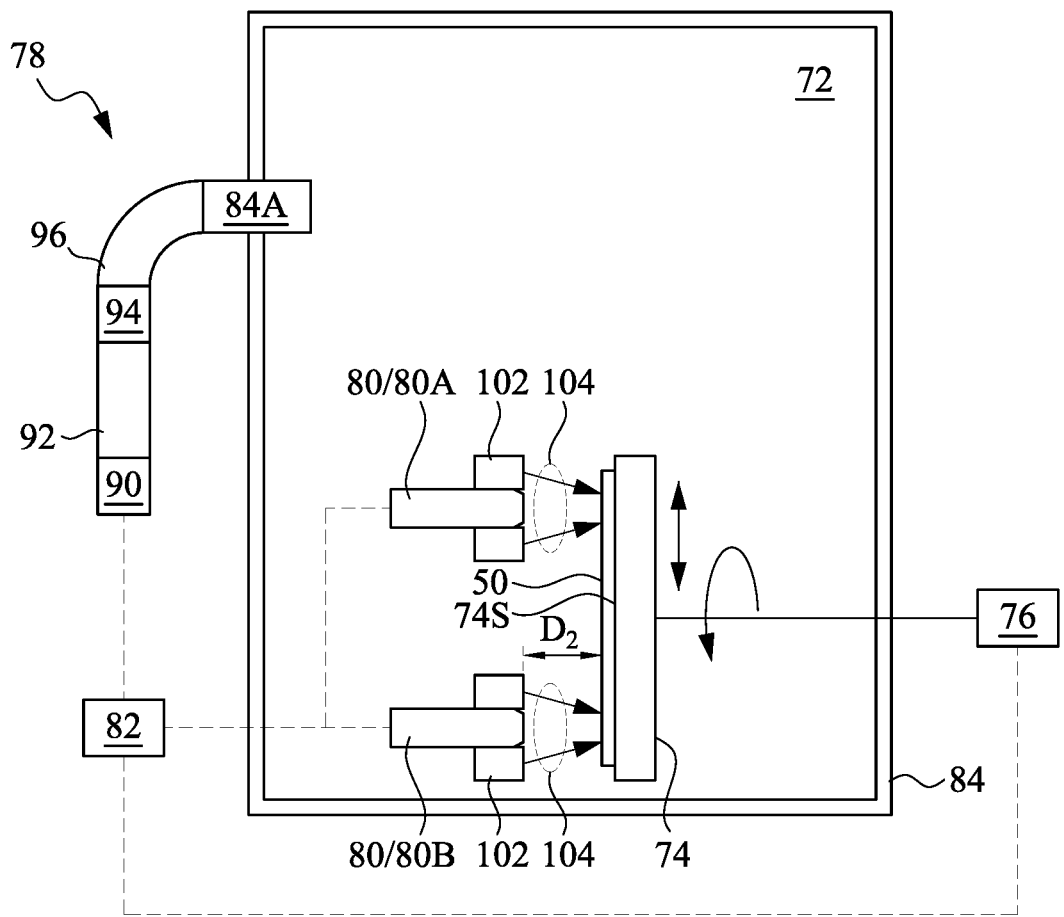
FIGS. 4A and 4B are diagrams of an ion exposure apparatus, in accordance with some embodiments.
Figure 4B:
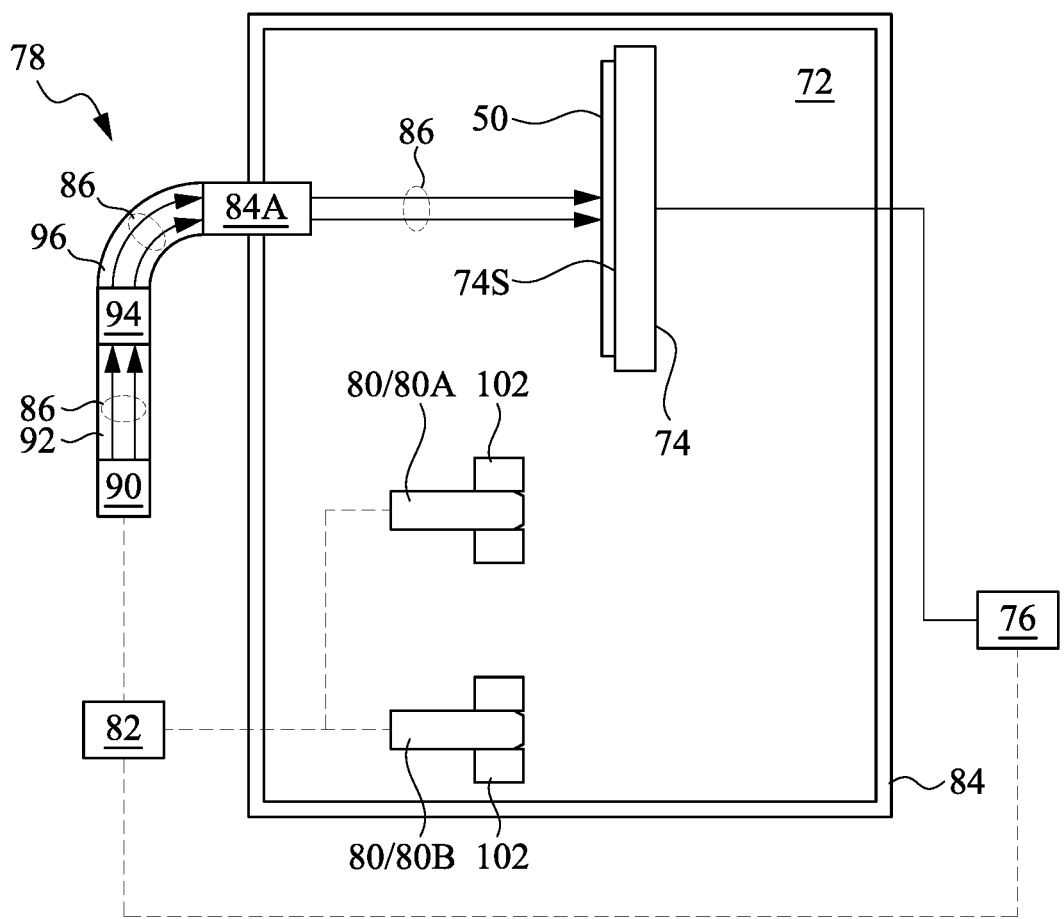

FIGS. 4A and 4B are diagrams of an ion exposure apparatus 70, in accordance with some embodiments. The ion exposure apparatus 70 is used to perform an ion exposure process in which a wafer 50 is exposed to an ion beam 86. The ion exposure apparatus 70 may be an implanter, an etcher, or the like. In some embodiments, the ion exposure apparatus 70 is an implanter. FIGS. 4A and 4B illustrate the ion exposure apparatus 70 in different states of operation, and are described together. In a first state of operation, the wafer 50 is disposed on a platen 74, and a wafer alignment process is performed using one or more camera(s) 80 (or more generally, alignment sensor(s)) to reduce the linear and/or angular displacement of the wafer 50 with respect to the ion beam 86, as shown by FIG. 4A. In a second state of operation, after the wafer alignment process is completed, the ion exposure process is performed by generating the ion beam 86 and exposing the wafer 50 to the ion beam 86, as shown by FIG. 4B. The ion exposure apparatus 70 includes a chamber 72, a platen 74, a drive mechanism 76, an ion beam generator 78, one or more camera(s) 80, and a controller 82.

The chamber 72 receives the wafer 50 and houses the wafer 50 during the ion exposure process. The chamber 72 may be any suitable shape for exposing the wafer 50 to the ion beam, such as a cylindrical shape, a hollow square tube, an octagonal shape, or the like. In some embodiments, the chamber 72 has a cylindrical sidewall, a planar bottom, and a planar top. The chamber 72 is defined by a chamber wall 84. The chamber wall 84 may be formed of a material that is inert to process conditions of the ion exposure process, such as steel, stainless steel, nickel, aluminum, combinations thereof, or like, so that the chamber wall 84 may withstand the chemistries involved in the ion exposure process. The chamber wall 84 may be shielded to improve inertness to the process conditions of the ion exposure process. For example, the chamber wall 84 may be covered with a plastic shield, coated with a polymer coating, or the like.

The platen 74 is disposed in the chamber 72, and is operable to support the wafer 50 during the ion exposure process. The platen 74 may be formed of a non-transparent material such as silicon carbide, graphite with a silicon carbide coating, combinations thereof, or the like. The platen 74 may be an implanter platen, an etcher platen, or the like, depending on the function of the ion exposure apparatus 70. The wafer 50 may be secured to a top surface 74S of the platen 74 using vacuum pressure, electrostatic forces, or the like. The top surface 74S of the platen 74 is faced towards the ion beam generator 78 during operation so that the ion beam 86, when generated, is normal to the top surface 74S of the platen 74. The wafer 50 is thus exposed to the ion beam 86. The platen 74 may include heating and/or cooling mechanisms in order to control the temperature of the wafer 50 during the ion exposure process. Depending on the function of the ion exposure apparatus 70, the platen 74 may include additional features which are desirable for that function. In some embodiments where the ion exposure apparatus 70 is an etcher, the platen 74 includes a bias generator operable to generate a bias (e.g., a direct current (DC) bias) on the wafer 50.

The drive mechanism 76 is connected to the platen 74, and is operable to move the platen 74 within the chamber 72 to reduce the linear displacement and/or the angular displacement of the wafer 50 with respect to the ion beam 86. Specifically, the drive mechanism 76 is operable to rotate the platen 74 around an axis of rotation (e.g., in the Z-direction), and is also operable to translate the platen 74 in a linear direction (e.g., in the X-direction and the Y-direction). The axis of rotation is perpendicular to the top surface 74S of the platen 74, and the plane of translation is parallel to the top surface 74S of the platen 74. In some embodiments (subsequently described for FIGS. 8A and 8B), the drive mechanism 76 is also operable to tilt the platen 74 so that the wafer 50 may be oriented in different directions during different states of operation. For example, the wafer 50 may be oriented to be parallel to the ion beam 86 during the wafer alignment process (e.g., in the first state of operation), and the drive mechanism 76 may then be used to tilt the platen 74 by 90 degrees so that the wafer 50 is perpendicular to the ion beam 86 during the ion exposure process (e.g., in the second state of operation).

The ion beam generator 78 is operable to generate the ion beam 86. In some embodiments where the ion exposure apparatus 70 is an implanter, the ion beam 86 is a beam of ions of a desired material, and the ion beam 86 is directed at the wafer 50 so that the material is impinged on (and thus implanted in) the wafer 50. For example, the material may be a dopant that is implanted into semiconductor features that were patterned in the wafer 50. The ion beam generator 78 includes an ion source 90, a linear accelerator 92, a scanning unit 94, and a separation magnet 96.

The ion source 90 may include a variety of components which are used to generate the ion beam 86. For example, the ion source 90 may include ion separation devices, ion acceleration devices, multiples or combinations thereof, or the like. In some embodiments, the ion source 90 is an arc discharge ion source. The ion source 90 may generate the ion beam 86 from various atoms or molecules, which may include boron (B), aluminum (Al), gallium (Ga), indium (In), carbon (C), silicon (Si), germanium (Ge), nitrogen ($N_2$), phosphorous (P), arsenic (As), antimony (Sb), oxygen ($O_2$), fluorine ($F_2$), helium (He), argon (Ar), carbon monoxide (CO), carbon dioxide ($CO_2$), boron mono-fluoride (BF), boron di-fluoride ($BF_2$), boron tri-fluoride ($BF_3$), silicon mono-fluoride (SiF), silicon di-fluoride ($SiF_2$), silicon tri-fluoride ($SiF_3$), silicon tetrafluoride ($SiF_4$), phosphorous dimer ($P_2$), silane ($SiH_4$), methane ($CH_4$), combinations thereof, or the like. However, other atoms or molecules may be used as the ion source 90. The ion source 90 may produce ions having a broad range of charge-to-mass ratios with only a certain narrower range of charge-to-mass ratios being suitable for the ion exposure process. As such, the ion beam 86 may be directed towards a separation magnet which electromagnetically separates those ions having desired charge-to-mass ratios for the ion exposure process from those ions having undesired charge-to-mass ratios (also referred to as a "mass analysis magnet"). The ion beam 86 thus includes ions having suitable charge-to-mass ratios. Next the ion beam 86 may be passed through an aperture in order to further enhance and control the divergence of the ion beam 86. In some embodiments, the aperture is an aperture with an adjustable width that can adjust the magnitude of the ion beam 86. Once the ion beam 86 passes through the aperture, the ion beam 86 may be sent to a linear accelerator 92.

The linear accelerator 92 may be used to impart additional energy to the ion beam 86 as it passes through the linear accelerator 92. The linear accelerator 92 imparts this additional energy using a series of electrodes (not separately illustrated) that generate an electromagnetic field. When the ion beam 86 passes through the electromagnetic field, the electromagnetic field works to accelerate the ion beam 86. The linear accelerator 92 may include multiple electromagnetic fields and may vary the electromagnetic fields periodically with time or may adjust the phase of the electromagnetic fields to accommodate ions with different atomic numbers as well as ions having different initial speeds.

Once accelerated, the ion beam 86 is directed towards a scanning unit 94. The scanning unit 94 is used to scan the ion beam 86 across the surface of the wafer 50. The scanning unit 94 may include at least a pair of horizontal electrodes and a pair of vertical electrodes for controlling horizontal scanning and vertical scanning, respectively, of the ion beam 86. In some embodiments, the scanning unit 94 is operable to scan the ion beam 86 to cover the entire area of the wafer 50. In some embodiments, the platen 74 is moved to scan the ion beam 86 to cover the entire area of the wafer 50. The drive mechanism 76 may be used to control the position of the wafer 50 relative to the ion beam 86. As such, the scanning unit 94 may be omitted in some embodiments. After the ion beam 86 is passed through the scanning unit 94, the ion beam 86 is passed through a converging unit. The converging unit may be utilized to modify the convergence and divergence of the ion beam 86, which may arrive from the linear accelerator 92 to the scanning unit 94 as a substantially parallel beam. In some embodiments, the converging unit includes one or more (such as three) multipole lenses. The multipole lenses may include a uniformity multipole lens, a collimator multipole lens, combinations thereof, or the like. However, any suitable number and type of lenses may be utilized. After the ion beam 86 is passed through the converging unit, the ion beam 86 is passed through a separation magnet 96 which may be used to remove ions and/or neutral particles that have been generated with undesired charge-to-mass ratios (also referred to as a "final energy magnet"). The separation magnet 96 may electromagnetically separate ions having desired charge-to-mass ratios for the ion exposure process from those ions having undesired charge-to-mass ratios.

After the ion beam 86 is passed through the separation magnet 96, the ion beam 86 is delivered to the platen 74 through an aperture 84A in the chamber wall 84. In some embodiments, the ion beam 86 is delivered to the platen 74 as a spot beam, which has a circular cross-section. In some embodiments, the ion beam 86 is be delivered to the platen 74 as a ribbon beam, which has a rectangular cross-section. The scanning unit 94 may be used to scan the ion beam 86 across the surface of the wafer 50 such that a uniform ion distribution is achieved across the surface of the wafer 50. As will be subsequently described in greater detail, the wafer 50 is aligned (linearly and/or angularly) with respect to the ion beam 86 in a wafer alignment process, prior to the ion exposure process, which helps increase the uniformity of the ion distribution across the surface of the wafer 50. This improves within-wafer uniformity of the ion exposure process, reduces wafer-to-wafer process variations, reduces device defects, and improves device performance.

The camera(s) 80 may be disposed in the chamber 72, and are used to measure the position of the wafer 50. As will be subsequently described in greater detail, a wafer alignment process is performed in which the linear and/or angular displacement of the wafer 50 with respect to the ion beam 86 is determined using the camera(s) 80, and the drive mechanism 76 is used to move the platen 74 relative to the ion beam 86 so as to reduce the linear and/or angular displacement of the wafer 50 with respect to the ion beam 86. The linear and/or angular displacement of the wafer 50 may be determined by measuring the positions of the alignment marks 52 (see FIG. 3) using the camera(s) 80. In some embodiments, the positions of the alignment marks 52 are measured by capturing images of the alignment marks 52 with the camera(s) 80 and detecting the positions of the alignment marks 52 in the images using machine vision. The camera(s) 80 may be charge-coupled device (CCD) cameras, complementary metal-oxide-semiconductor (CMOS) cameras, or the like. In some embodiments, the ion exposure apparatus 70 further includes one or more light source(s) 102 which are operable to generate light 104 and illuminate the wafer 50 so that the images captured with the camera(s) 80 have a high contrast. The light source(s) 102 may be camera flashes or the like, and the light 104 generated by the light source(s) 102 may be light that provides a high contrast, such as white light. The positions of the alignment marks 52 may thus be more accurately detected by the camera(s) 80. The light 104 generated by the light source(s) 102 may have a ring shape, a spotlight shape, or the like.

The resolution of the camera(s) 80 is constrained by the size of the alignment marks 52 and the distance between the camera(s) 80 and the wafer 50 (also referred to as the "working distance"). Specifically, the resolution of the camera(s) 80 should be large enough to resolve objects that are the dimensions of the alignment marks 52. The alignment marks 52 are large, and thus may be easily resolved by the camera(s) 80. For example, when the alignment marks 52 have a width of 488 µm and are separated by a distance of 280 µm, using camera(s) 80 with a resolution of 488 µm allows the angular displacement of the wafer 50 to be measured with ±0.1 degree of error. As such, camera(s) 80 with a low resolution may be used, reducing costs. Further, the use of large alignment marks 52 allows the distance between the camera(s) 80 and the wafer 50 to be large. In some embodiment, the working distance $D_2$ is up to 100 m. As will be subsequently described in greater detail, the use of the large working distance allows the camera(s) 80 to also be disposed outside the chamber 72, which allows space limits inside or outside the chamber 72 to be accommodated. Finally, the use of large alignment marks 52 allows the field of view of the camera(s) 80 to be small. Continuing the previous example, the camera(s) 80 may have a field of view as small as 2 degrees. As such, camera(s) 80 with narrow-angle lenses may be used, reducing costs.

The wafer alignment process is performed before the ion exposure process. Specifically, the wafer alignment process is performed before the ion beam 86 is generated, and is performed with the platen 74 disposed in a first position, as shown in FIG. 4A. After the wafer alignment process, the platen 74 is moved to a second position and the ion beam 86 is generated, as shown in FIG. 4B. The first position of the platen 74 is outside of the path of the ion beam 86 and the second positon of the platen 74 is in the path of the ion beam 86. The platen 74 is moved from the first position to the second position by translating the platen 74 along a direction (e.g., the Y-direction) with the drive mechanism 76. The wafer alignment process is performed while the platen 74 is in the first position, and the wafer 50 is moved relative to where the ion beam 86 will be generated when the platen 74 is in the second position. The distance between the first position and the second position is a constant distance that can be accounted for when aligning the wafer 50 with respect to the ion beam 86. In other words, the wafer alignment process is performed by determining where the ion beam 86 will be generated when the platen 74 is in the second position, and aligning the wafer 50 with respect to the ion beam 86 while the platen 74 is in the first position. Performing the wafer alignment process in the first position allows the camera(s) 80 to be disposed outside of the path of the ion beam 86, reducing interference with the ion beam 86 during the ion exposure process, and also reducing the accumulation of contaminants (e.g., particles) on the camera(s) 80. The accuracy of the wafer alignment process may thus be improved.

A controller 82 is communicatively coupled to the various features of the ion exposure apparatus 70, and is operable to control the operating parameters of the ion exposure apparatus 70. The controller 82 may be implemented in either hardware or software, and the parameters may be hardcoded or input to the controller 82 through an input device. The controller 82 may be used to store and control parameters associated with the operation of the ion exposure apparatus 70, such as the desired ion beam current, the current to the accelerator electrodes, and the like. Additionally, the controller 82 may also be used to control the platen 74 and, more specifically, the drive mechanism 76 to control the position, direction of movement, tilt angle, and the like of the wafer 50 with respect to the ion beam 86.

Figure 5:
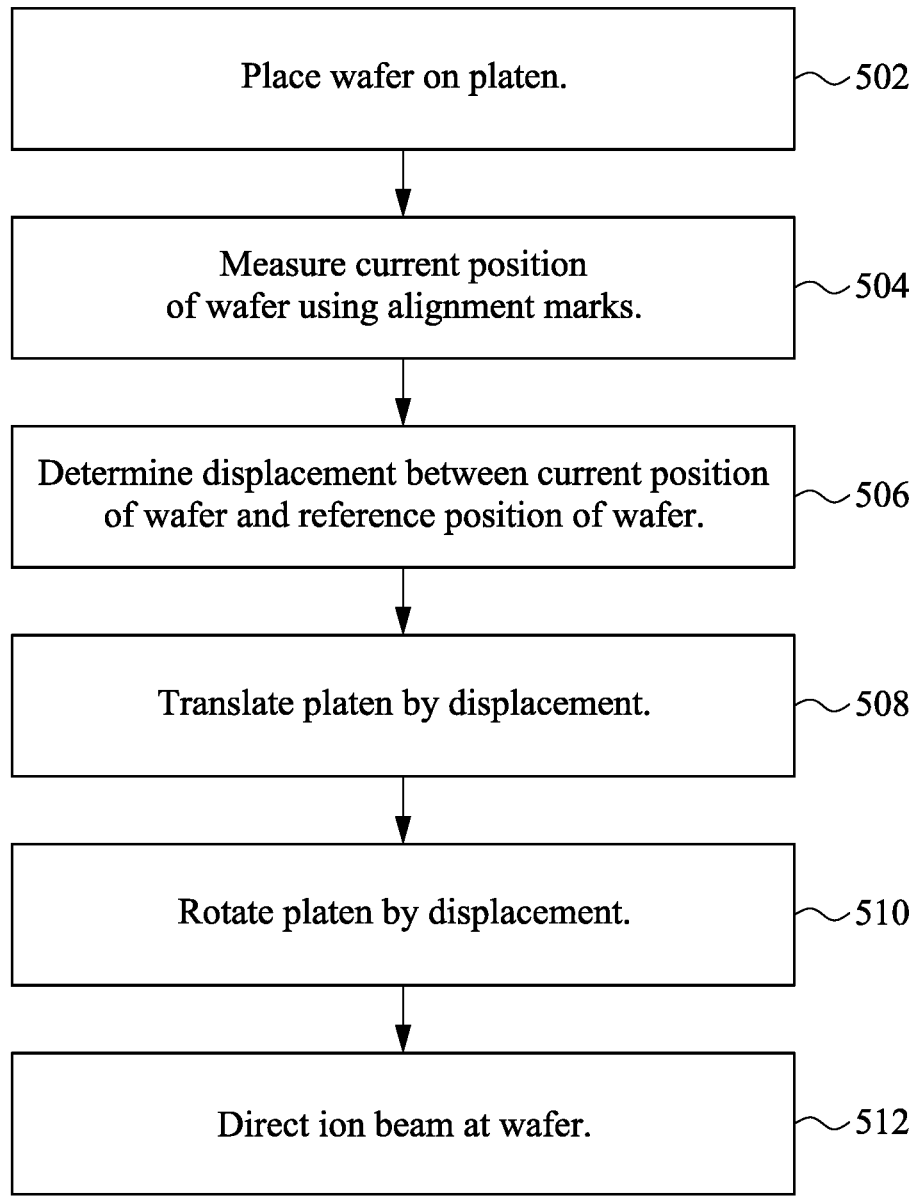
FIG. 5 is a flowchart of a method for manufacturing a semiconductor device, in accordance with some embodiments.
Figure 6A:
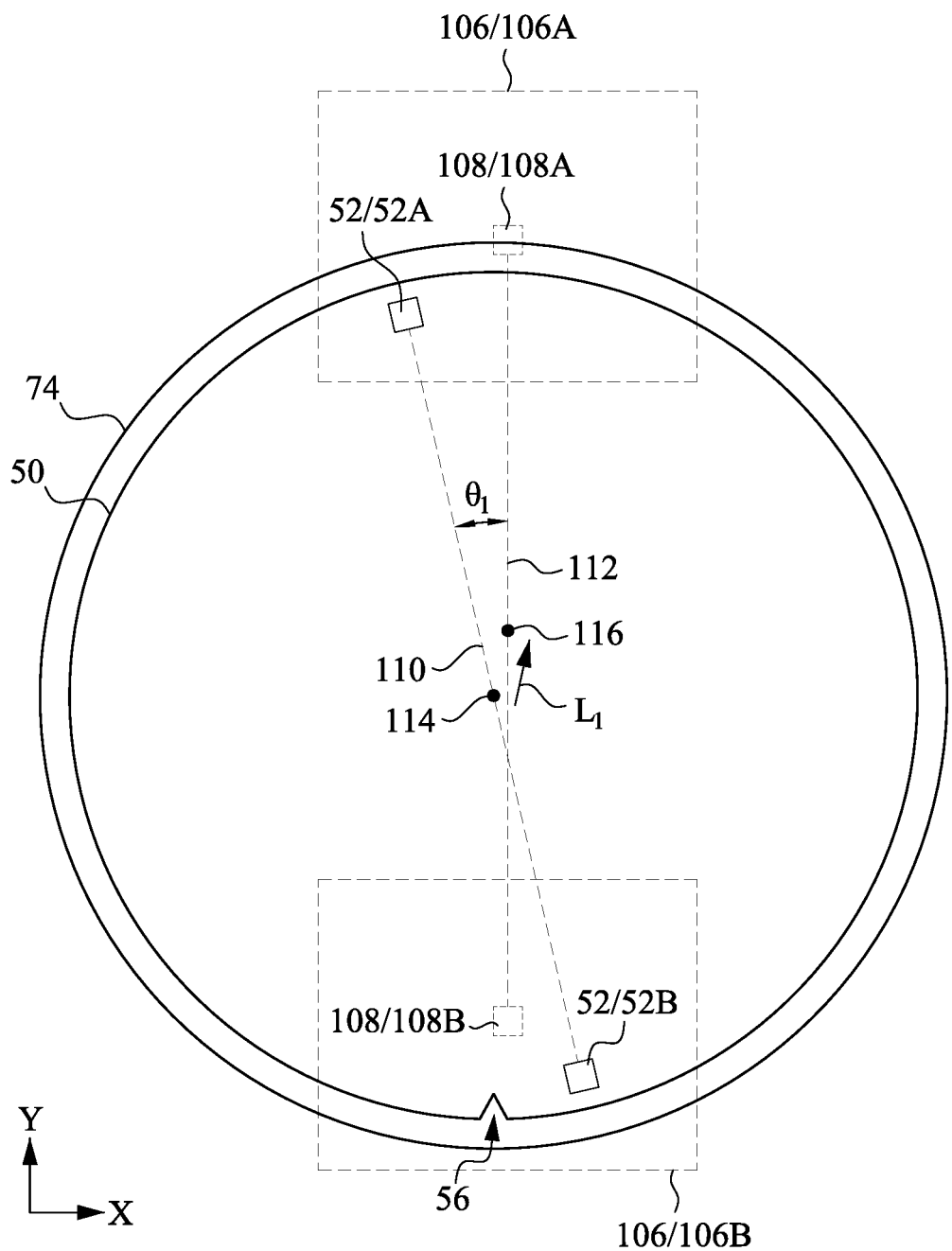
FIGS. 6A and 6B are top-down views of a platen during a wafer alignment process, in accordance with some embodiments.
Figure 6B:
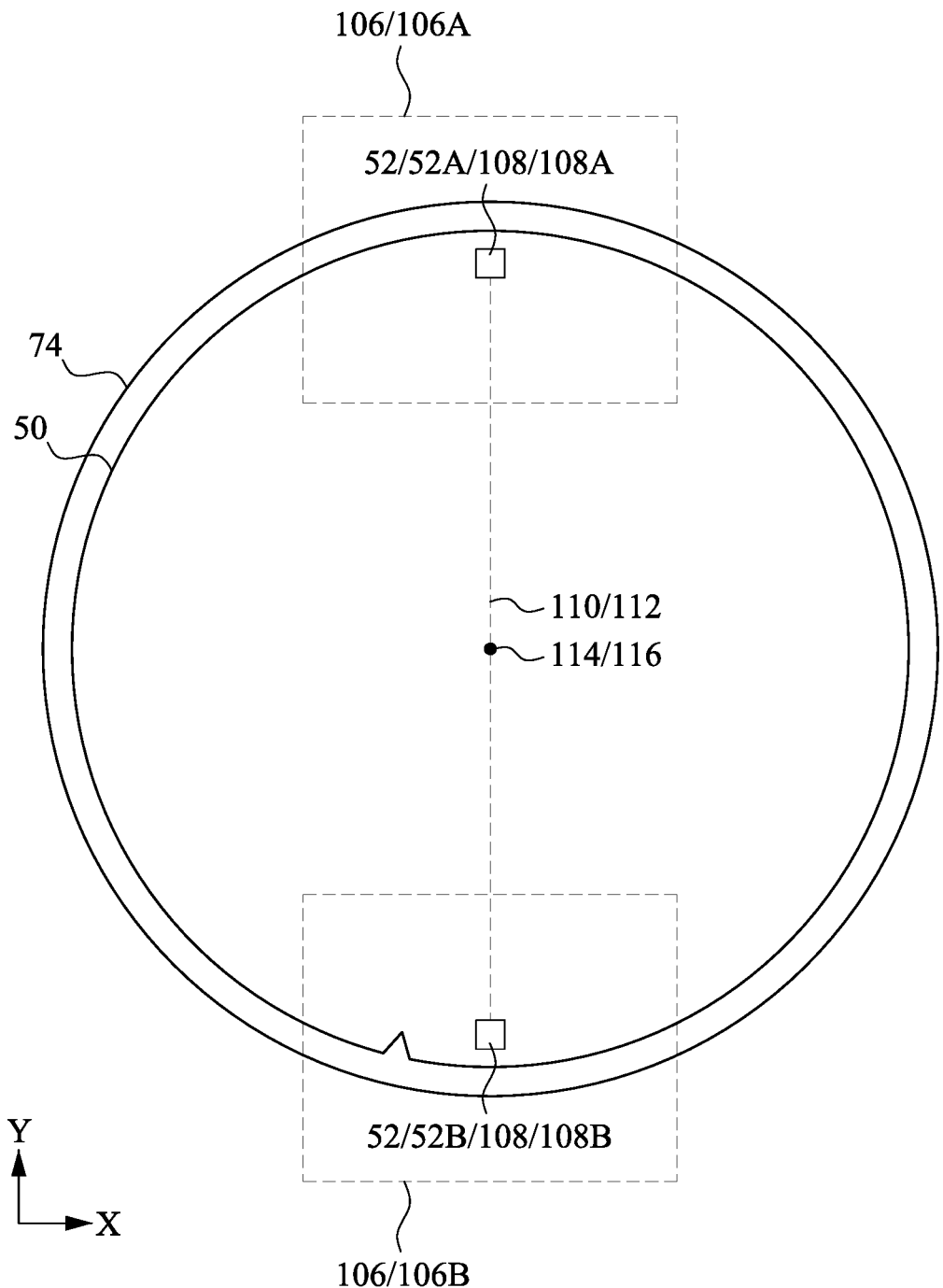

FIG. 5 is a flowchart of a method 500 for manufacturing a semiconductor device, in accordance with some embodiments. The method 500 may be performed using the ion exposure apparatus 70 of FIGS. 4A and 4B, which are described together with FIG. 5. Specifically, the method 500 may be performed by the controller 82 of the ion exposure apparatus 70, which controls the various features of the ion exposure apparatus 70 to perform the steps of the method 500. The method 500 includes steps for a wafer alignment process (e.g., steps 504-510) and steps for an ion exposure process (e.g., step 512). FIGS. 6A and 6B are top-down views of the platen 74 during the wafer alignment process, and are also described together with FIG. 5.

In step 502, the wafer 50 is placed on the platen 74. The wafer 50 is initially oriented on the platen 74 using the notch 56. Orienting the wafer 50 using the notch 56 provides a starting point for wafer alignment, which helps ensure the alignment marks 52 are within the field of view 106 of the camera(s) 80.

In step 504, the current position (or instant position) of the wafer 50 is measured using the alignment marks 52. The current position of the wafer 50 is measured by measuring the current positions (or instant positions) of the alignment marks 52 with machine vision using the camera(s) 80. Specifically, the alignment marks 52 are photographed using the camera(s) 80, and the pattern of the gratings 62 (see FIG. 2) of the alignment marks 52 is recognized in the photographs with machine vision. In some embodiment where the wafer 50 includes a pair of alignment marks 52 (including a first alignment mark 52A and a second alignment mark 52B), the current position of the first alignment mark 52A is measured with a first camera 80A and the current position of the second alignment mark 52B is measured with a second camera 80B. The first camera 80A has a first field of view 106A, and the current position of the first alignment mark 52A in the first field of view 106A (e.g., along the X-direction and the Y-direction) is measured with machine vision. The second camera 80B has a second field of view 106B, and the current position of the second alignment mark 52B in the second field of view 106B (e.g., along the X-direction and the Y-direction) is measured with machine vision.

In step 506, the displacement between the current position of the wafer 50 and a reference position of the wafer 50 is determined. The reference position of the wafer 50 is defined by reference positions 108 for the alignment marks 52, and is referenced with respect to the ion beam 86. The wafer 50 is aligned with respect to the ion beam 86 when each alignment mark 52 is substantially aligned (within process variations) with its respective reference position 108. In the illustrated embodiment, the reference positions 108 include a first reference position 108A for the first alignment mark 52A (in the first field of view 106A) and a second reference position 108B for the second alignment mark 52B (in the second field of view 106B). The displacement of the wafer 50 includes a linear displacement and/or an angular displacement.

The angular displacement $\theta_1$ between the current position of the wafer 50 and the reference position of the wafer 50 with respect to the ion beam 86 is determined by calculating the angle between a first line 110 and a second line 112. The first line 110 passes through the current position of the first alignment mark 52A and the current position of the second alignment mark 52B. The second line 112 passes through the first reference position 108A and the second reference position 108B. The angular displacement $\theta_1$ may be calculated using Equation (1), in which $m_1$ is the slope of the first line 110 (in the X-direction and the Y-direction) and $m_2$ is the slope of the second line 112 (in the X-direction and the Y-direction). The slope of the first line 110 may be calculated from the current position of the first alignment mark 52A and the current position of the second alignment mark 52B (in the X-direction and the Y-direction), and the slope of the second line 112 may be a known value that is calculated from the first reference position 108A and the second reference position 108B (in the X-direction and the Y-direction).

$$\theta_1 = \tan^{-1}\left(\frac{m_1 - m_2}{1 + m_1 m_2}\right) \quad (1)$$

The linear displacement $L_1$ between the current position of the wafer 50 and the reference position of the wafer 50 with respect to the ion beam 86 is determined by calculating a vector (in the X-direction and the Y-direction) between the current position 114 of the center of the wafer 50 and a reference position 116 of the center of the wafer 50. The first line 110 passes through the current position 114 of the center of the wafer 50, and the current position 114 of the center of the wafer 50 may be calculated from the current position of the first alignment mark 52A and the current position of the second alignment mark 52B (in the X-direction and the Y-direction). The second line 112 passes through the reference position 116 of the center of the wafer 50, and the reference position 116 of the center of the wafer 50 may be calculated from the first reference position 108A and the second reference position 108B (in the X-direction and the Y-direction). For example, the current position 114 of the center of the wafer 50 may be at the midpoint of the first line 110, the reference position 116 of the center of the wafer 50 may be at the midpoint of the second line 112, and the positions may be calculated by calculating those midpoints.

In step 508, the platen 74 is optionally translated by the linear displacement $L_1$. The platen 74 is thus moved so that the current position 114 of the center of the wafer 50 is aligned with the reference position 116 of the center of the wafer 50. The platen 74 may be moved by actuating the drive mechanism 76 to move the platen 74 by a desired distance along each direction (e.g., the X-direction and the Y-direction).

In step 510, the platen 74 is rotated by the angular displacement $\theta_1$. The platen 74 is thus rotated so that the first line 110 is aligned with the second line 112 (e.g., the first line 110 and the second line 112 have the same slope). The platen 74 may be rotated by actuating the drive mechanism 76 to rotate the platen 74 by a desired distance around an axis of rotation.

After steps 508-510, the first alignment mark 52A is aligned (within process variations) with the first reference position 108A, and the second alignment mark 52B is aligned (within process variations) with the second reference position 108B. Some embodiments contemplate variations. In some embodiments, step 508 is omitted so that correction of the linear displacement $L_1$ is not performed, and step 510 is performed so that only correction of the angular displacement $\theta_1$ is performed.

In step 512, the ion beam 86 is directed at the wafer 50. Specifically, the platen 74 is translated by actuating the drive mechanism 76 to move the wafer from the first position (see FIG. 4A) to the second position (see FIG. 4B). The ion beam 86 is then generated using the ion beam generator 78. Moving the wafer 50 to the second position in the path of the ion beam 86 allows the ion beam 86 to be directed at the wafer 50 when it is generated.

Figure 7:
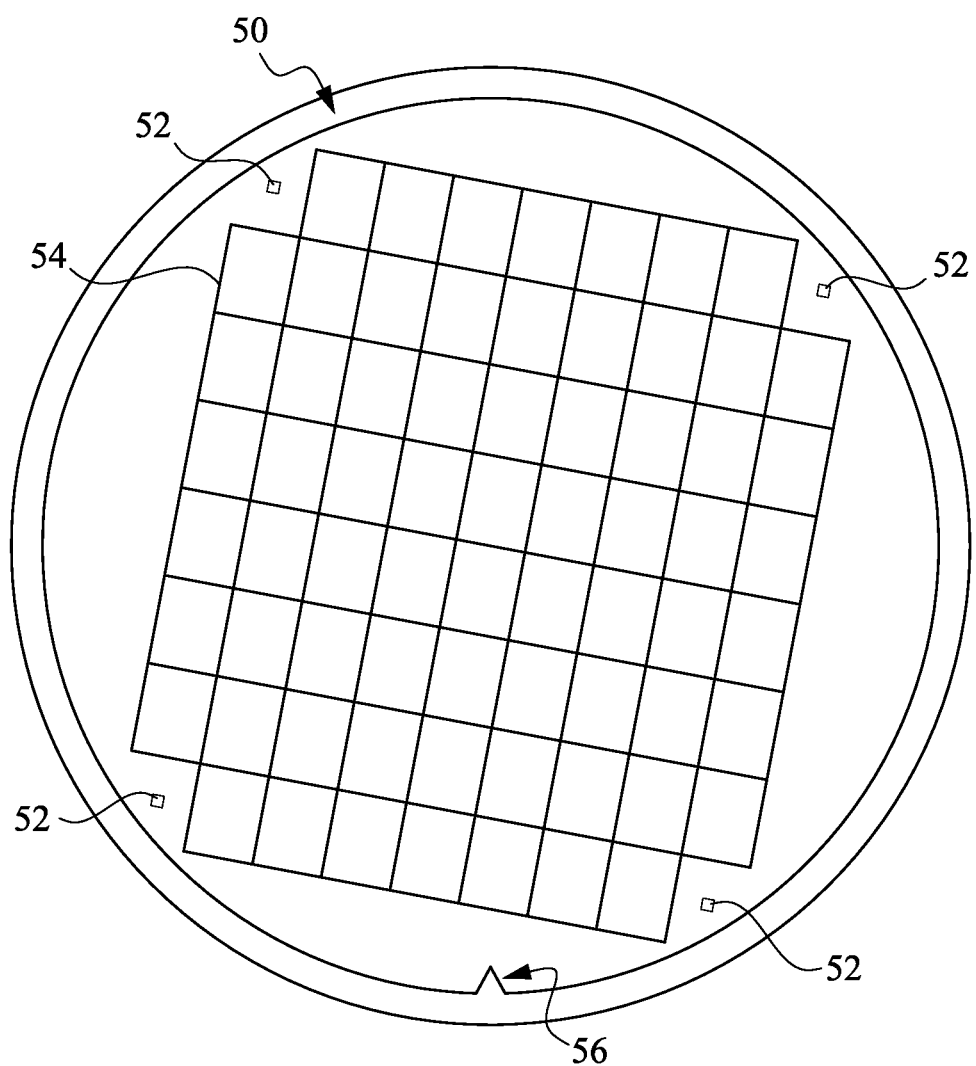
FIG. 7 is a top-down view of a wafer on a platen, in accordance with some embodiments.

FIG. 7 is a top-down view of a wafer 50 on a platen 74 during an ion exposure process, in accordance with some embodiments. In this embodiment, the wafer 50 includes multiple pairs of the alignment marks 52, and the ion exposure apparatus 70 may include camera(s) 80 for each of the alignment marks 52. During the wafer alignment process, each of the alignment marks 52 are aligned with corresponding reference positions in the field of view of the camera(s) 80. The use of more pairs of the alignment marks 52 may increase the accuracy of the wafer alignment process.

Some embodiments contemplate variations of the camera(s) 80. In some embodiments, the ion exposure apparatus 70 includes a single camera 80, which is the only camera to measure the current position of the wafer 50. The current positions of the alignment marks 52 may be captured sequentially, with the platen 74 rotated after each alignment mark 52 is photographed so that the next alignment mark 52 may be photographed. For example, when the wafer 50 includes a pair of the alignment marks 52, the current position of the wafer 50 may be measured in step 504 (see FIG. 5) by measuring the current positions of the first alignment mark 52A with the camera 80, rotating the platen 74 by 180 degrees, and then measuring the current positions of the second alignment mark 52B with the camera 80. In some embodiments, the camera(s) 80 are disposed outside the chamber 72.

Figure 8A:
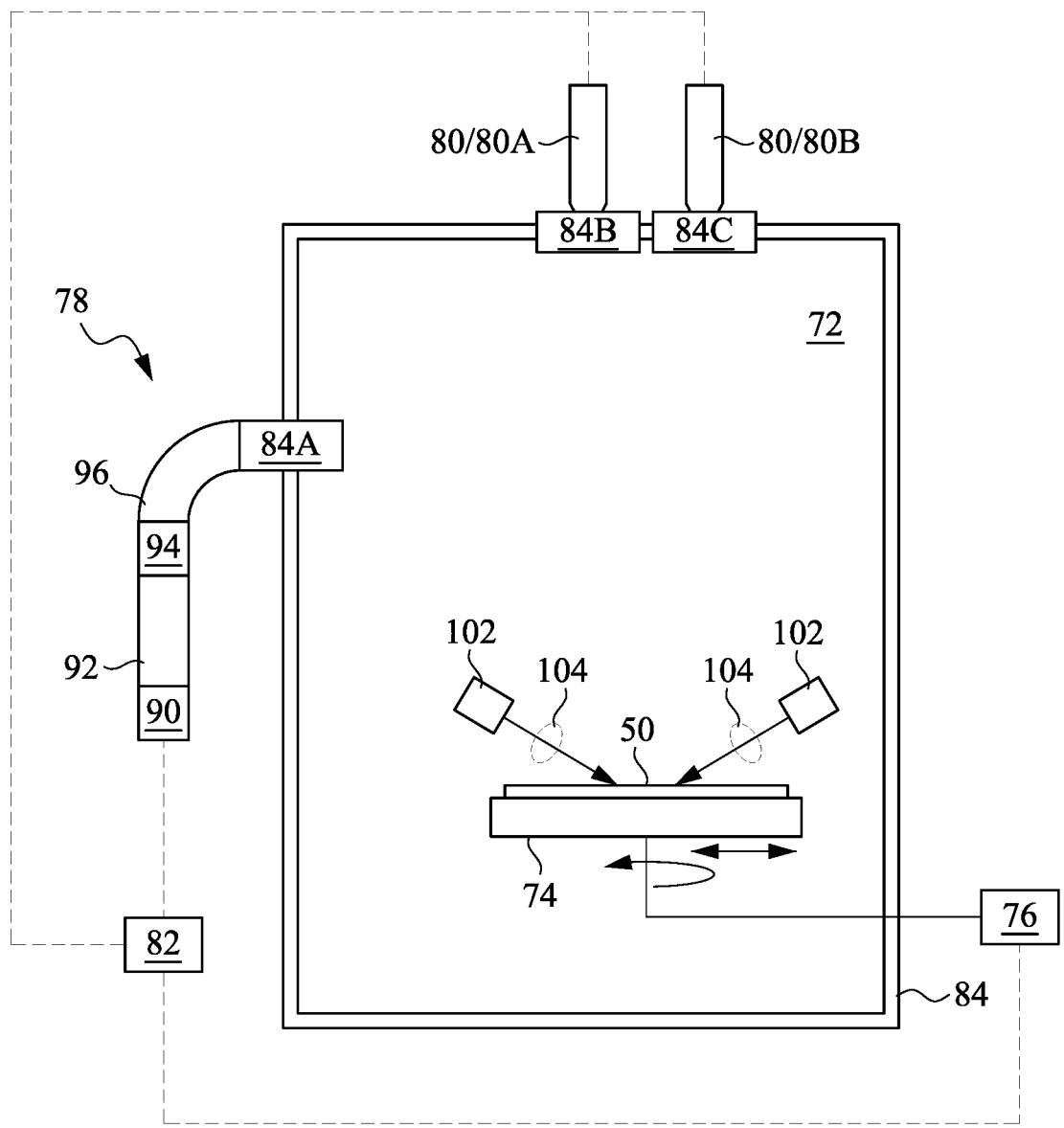
FIGS. 8A and 8B are diagrams of an ion exposure apparatus, in accordance with some embodiments.
Figure 8B:
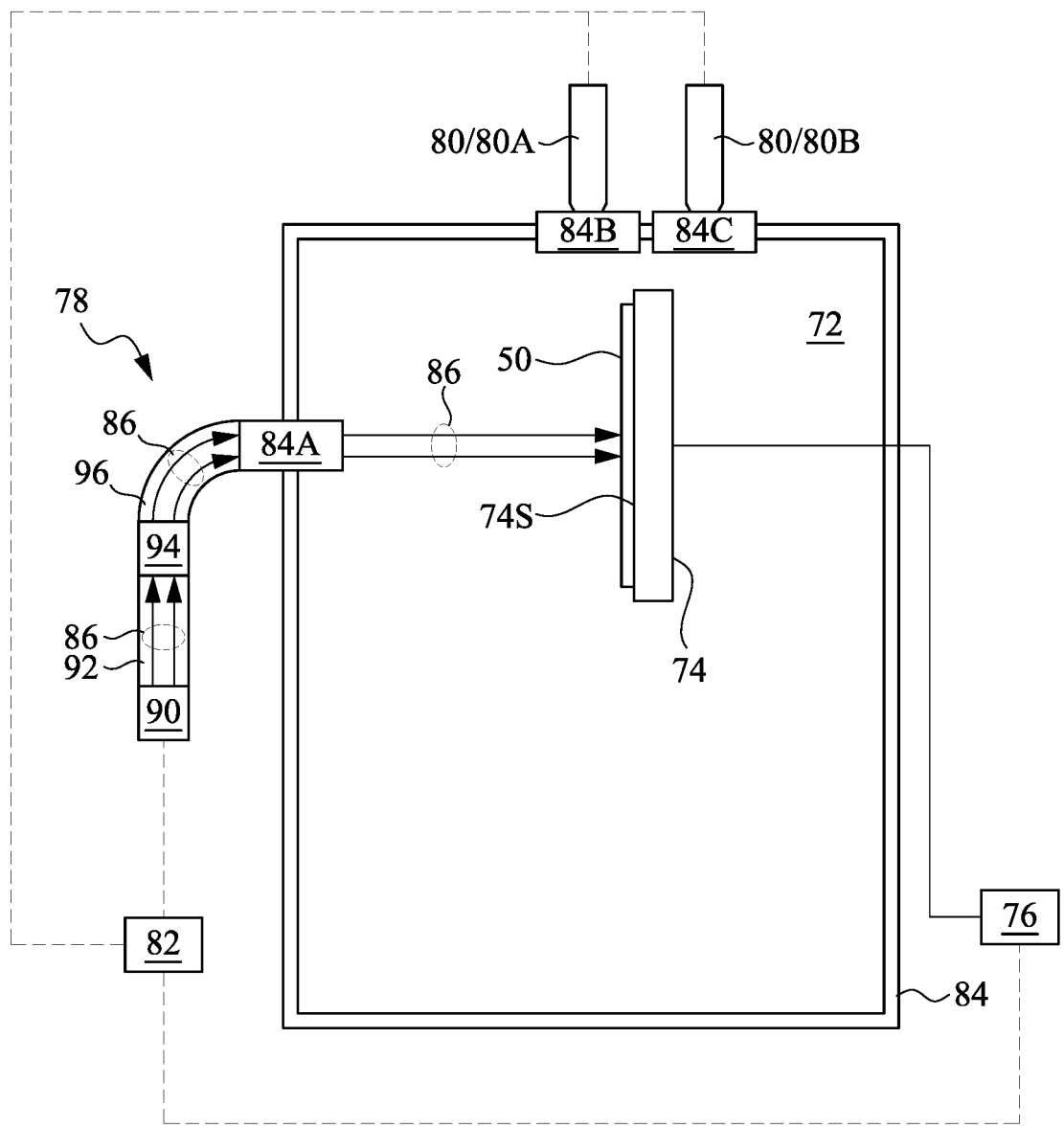

FIGS. 8A and 8B are diagrams of an ion exposure apparatus 70, in accordance with some embodiments. This embodiment is similar to the embodiment of FIGS. 4A and 4B, except the camera(s) 80 are disposed outside of the chamber 72. The camera(s) 80 are operable to photograph the wafer 50 through apertures 84B, 84C in the chamber wall 84. The apertures 84B, 84C may be disposed at the top of the chamber 72. For example, the ion beam generator 78 may be large and disposed at the sides of the chamber 72, leaving no room for the camera(s) 80 to be disposed outside of and at the sides of the chamber 72. Further in this embodiment, the drive mechanism 76 is also operable to tilt the platen 74 so that the wafer 50 may be oriented in different directions. Specifically, the wafer 50 may be oriented to be parallel to the ion beam 86 during the wafer alignment process, as shown by FIG. 8A, and the drive mechanism 76 may then be used to tilt the platen 74 by 90 degrees so that the wafer 50 is perpendicular to the ion beam 86 during the ion exposure process, as shown by FIG. 8B. In some embodiments, the light source(s) 102 are disposed in the chamber 72 so that the wafer 50 may still be sufficiently illuminated by the light 104. The light source(s) 102 may be offset from the apertures 84B, 84C and may be oriented diagonally with the surface of the wafer 50, to improve scattering of the light 104.

Embodiments may achieve advantages. Performing the wafer alignment process by measuring positions of the alignment marks 52 with the camera(s) 80 allows the wafer 50 to be more accurately aligned (linearly and/or angularly) with respect to the ion beam 86 during the ion exposure process. Aligning the wafer 50 with respect to the ion beam 86 may improve within-wafer uniformity of the ion exposure process, reduce wafer-to-wafer process variations, reduce device defects, and improve device performance. Further, forming large alignment marks 52 on the wafers 50 allows the camera(s) 80 to be low-resolution cameras with narrow-angle lenses, reducing costs.

In an embodiment, a method includes: placing a wafer on an implanter platen, the wafer including alignment marks; measuring a position of the wafer by measuring positions of the alignment marks with one or more cameras; determining an angular displacement between the position of the wafer and a reference position of the wafer; and rotating the implanter platen by the angular displacement. In some embodiments, the method further includes, before placing the wafer on the implanter platen: patterning the alignment marks in the wafer with a first patterning process that is aligned to a notch in the wafer; and patterning a semiconductor feature in the wafer with a second patterning process that is aligned to the alignment marks. In some embodiments, the method further includes, after rotating the implanter platen: implanting a dopant into the semiconductor feature. In some embodiments, the method further includes: determining a linear displacement between the position of the wafer and the reference position of the wafer; and translating the implanter platen by the linear displacement. In some embodiments of the method, the wafer includes a notch, and placing the wafer on the implanter platen includes aligning the wafer using the notch. In some embodiments of the method, the wafer includes a single pair of the alignment marks. In some embodiments of the method, the wafer includes a plurality of pairs of the alignment marks.

In an embodiment, a method includes: placing a wafer on an implanter platen, the wafer including a first alignment mark and a second alignment mark; measuring a first position of the first alignment mark and a second position of the second alignment mark; determining an angle between a first line and a second line, the first line passing through the first position of the first alignment mark and the second position of the second alignment mark, the second line passing through a first reference position for the first alignment mark and a second reference position for the second alignment mark; and rotating the implanter platen by the angle. In some embodiments of the method, a center of the wafer is disposed between the first alignment mark and the second alignment mark, the method further including: determining a vector between a third position of the center of the wafer and a third reference position for the center of the wafer, the first line passing through the third position of the center of the wafer, the second line passing through the third reference position for the center of the wafer; and translating the implanter platen by the vector. In some embodiments of the method, the wafer is placed on a surface of the implanter platen, the implanter platen is rotated around an axis, and the implanter platen is translated in a linear direction, the linear direction being parallel to the surface of the implanter platen, the axis being perpendicular to the surface of the implanter platen. In some embodiments of the method, measuring the first position of the first alignment mark and the second position of the second alignment mark includes: capturing a first image of the first alignment mark with a first camera; capturing a second image of the second alignment mark with a second camera; and detecting the first position of the first alignment mark in the first image and the second position of the second alignment mark in the second image using machine vision. In some embodiments of the method, measuring the first position of the first alignment mark and the second position of the second alignment mark includes: capturing a first image of the first alignment mark with a camera; rotating the implanter platen; capturing a second image of the second alignment mark with the camera; and detecting the first position of the first alignment mark in the first image and the second position of the second alignment mark in the second image using machine vision. In some embodiments of the method, the first reference position and the second reference position are referenced with respect to an ion beam, the method further including: after rotating the implanter platen by the angle, directing the ion beam at the wafer. In some embodiments of the method, the first position of the first alignment mark and the second position of the second alignment mark are measured with the implanter platen disposed in a first position outside of a path of the ion beam, the method further including: moving the implanter platen to a second position in the path of the ion beam.

In an embodiment, an apparatus includes: a chamber; a platen in the chamber, the platen operable to support a wafer; a drive mechanism connected to the platen, the drive mechanism operable to move the platen within the chamber; an ion beam generator operable to direct an ion beam at the platen; a camera operable to measure positions of alignment marks on the wafer; and a controller communicatively coupled to the camera, the ion beam generator, and the drive mechanism, the controller configured to: determine a position of the wafer from the positions of the alignment marks; determine a displacement between the position of the wafer and the ion beam; and reduce the displacement between the position of the wafer and the ion beam by controlling the drive mechanism to move the platen within the chamber. In some embodiments of the apparatus, the camera is disposed in the chamber. In some embodiments of the apparatus, the camera is disposed outside the chamber. In some embodiments of the apparatus, the camera is a charge-coupled device (CCD) camera. In some embodiments of the apparatus, the camera is the only camera operable to measure the position of the wafer. In some embodiments of the apparatus, the camera is one of a plurality of camera operable to measure the position of the wafer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   placing a wafer on a platen in a chamber, the wafer comprising alignment marks;
   measuring a current position of the wafer by measuring positions of the alignment marks with one or more cameras, the alignment marks being measured with the platen disposed in a first position in the chamber, the first position being outside a path of an ion beam, the cameras being disposed outside the chamber, one or more apertures for the cameras being disposed at a top of the chamber, wherein measuring the positions of the alignment marks comprises:
      capturing images of the alignment marks with the cameras; and
      detecting the positions of the alignment marks in the images using machine vision;
   determining a displacement between the current position of the wafer and a reference position of the wafer with respect to the ion beam;
   reducing the displacement between the current position of the wafer and the reference position of the wafer;
   moving the platen from the first position to a second position in the chamber, the second position being in the path of the ion beam; and
   generating the ion beam with an ion beam generator, the ion beam generator being disposed at a side of the chamber.

2. The method of claim 1, wherein the displacement further comprises a linear displacement and reducing the displacement further comprises translating the platen by the linear displacement.

3. The method of claim 1, wherein capturing the images of the alignment marks with the cameras comprises:
   capturing a first image of a first alignment mark with a first camera; and
   capturing a second image of a second alignment mark with a second camera.

4. The method of claim 1, wherein capturing the images of the alignment marks with the cameras comprises:
   capturing a first image of a first alignment mark with a first camera;
   rotating the platen; and
   capturing a second image of a second alignment mark with the first camera.

5. The method of claim 1, further comprising:
   forming integrated circuit dies in the wafer with a patterning process that is aligned to the alignment marks.

6. The method of claim 1, wherein each of the alignment marks comprises a plurality of gratings that are oriented in different directions, each of the gratings comprising a plurality of trenches in the wafer.

7. The method of claim 6, wherein detecting the positions of the alignment marks in the images comprises recognizing a pattern of the trenches in the images.

8. A method comprising:
   placing a wafer on a platen, the wafer comprising a first alignment mark and a second alignment mark;
   measuring a first measured position of the first alignment mark and a second measured position of the second alignment mark, wherein measuring the first measured position of the first alignment mark and the second measured position of the second alignment mark comprises:
      capturing a first image of the first alignment mark;
      capturing a second image of the second alignment mark; and
      detecting the first measured position of the first alignment mark in the first image and the second measured position of the second alignment mark in the second image using machine vision;
   determining an angle between a first line and a second line, the first line passing through the first measured position of the first alignment mark and the second measured position of the second alignment mark, the second line passing through a first reference position for the first alignment mark and a second reference position for the second alignment mark; and rotating the platen by the angle.

9. The method of claim 8, wherein a center of the wafer is disposed between the first alignment mark and the second alignment mark, the method further comprising:

determining a vector between a third measured position of the center of the wafer and a third reference position for the center of the wafer, the first line passing through the third measured position of the center of the wafer, the second line passing through the third reference position for the center of the wafer; and translating the platen by the vector.

10. The method of claim 9, wherein the wafer is placed on a surface of the platen, the platen is rotated around an axis, and the platen is translated in a linear direction, the linear direction being parallel to the surface of the platen, the axis being perpendicular to the surface of the platen.

11. The method of claim 8, wherein the first reference position and the second reference position are referenced with respect to an ion beam, the method further comprising:

after rotating the platen by the angle, directing the ion beam at the wafer.

12. The method of claim 11, wherein the first measured position of the first alignment mark and the second measured position of the second alignment mark are measured with the platen disposed outside of a path of the ion beam, the method further comprising:

moving the platen into the path of the ion beam.

13. A method comprising:

placing a wafer on a platen in a chamber, the wafer comprising alignment marks;

measuring a measured position of the wafer by measuring positions of the alignment marks with a camera while the platen is disposed in a first position in the chamber, the first position being outside a path of an ion beam, the camera being disposed outside the chamber, an aperture for the camera being disposed at a top of the chamber, wherein measuring the positions of the alignment marks comprises:

capturing images of the alignment marks with the camera; and detecting the positions of the alignment marks in the images using machine vision;

determining a displacement between the measured position of the wafer and a reference position of the wafer with respect to the ion beam, the displacement comprising an angular displacement and a linear displacement;

rotating the platen by the angular displacement;

translating the platen by the linear displacement;

moving the platen from the first position to a second position in the chamber, the second position being in the path of the ion beam; and directing the ion beam at the wafer, wherein directing the ion beam at the wafer comprises generating the ion beam with an ion beam generator, the ion beam generator being disposed at a side of the chamber.

14. The method of claim 13, wherein the wafer comprises integrated circuit dies, the integrated circuit dies being located between the alignment marks.

15. The method of claim 13, further comprising:

forming the alignment marks with a patterning process that is aligned to a notch in the wafer.

16. The method of claim 13, wherein each of the alignment marks comprises a plurality of gratings that are oriented in different directions, and detecting the positions of the alignment marks in the images comprises recognizing a pattern of the gratings in the images.

17. The method of claim 13, wherein the images of the alignment marks are captured with a single camera.

18. The method of claim 13, wherein the images of the alignment marks are captured with a plurality of cameras.

19. The method of claim 13, wherein each of the alignment marks comprises a plurality of gratings, each of the gratings comprising a plurality of trenches, a first subset of the gratings being oriented so that their trenches have longitudinal axes in a first direction, a second subset of the gratings being oriented so that their trenches have longitudinal axes in a second direction.

20. The method of claim 13, wherein the wafer is parallel to the path of the ion beam in the first position, and is perpendicular to the path of the ion beam in the second position.

* * * * *